United States Patent
Kugimiya et al.

[11] Patent Number: 5,164,264
[45] Date of Patent: Nov. 17, 1992

[54] COMPOSITE SUBSTRATE

[75] Inventors: Koichi Kugimiya; Ken Hirota; Mitsuo Satomi, all of Osaka, Japan

[73] Assignee: Matsushita Electric Industrial Co., Ltd., Osaka, Japan

[21] Appl. No.: 535,075

[22] Filed: Jun. 8, 1990

[30] Foreign Application Priority Data

Jun. 9, 1989 [JP] Japan .................. 1-147903

[51] Int. Cl.⁵ .............................................. B32B 5/16
[52] U.S. Cl. .................................... 428/403; 428/328; 428/329; 501/95
[58] Field of Search ............. 428/328, 329, 403, 65; 501/95

[56] References Cited

U.S. PATENT DOCUMENTS

| | | | |
|---|---|---|---|
| 3,391,055 | 7/1968 | Veres | 428/328 |
| 3,473,958 | 10/1969 | Waku | 428/328 |
| 3,719,519 | 3/1973 | Perugini | 428/328 |
| 3,926,567 | 12/1975 | Fletcher et al. | 29/182.5 |
| 4,258,100 | 3/1981 | Fujitani et al. | 428/315 |
| 4,447,492 | 5/1984 | McKaveney | 428/328 |
| 4,636,434 | 1/1987 | Okamura et al. | 428/328 |
| 4,650,712 | 3/1987 | Hirose | 428/323 |
| 4,848,348 | 7/1989 | Craighead | 128/639 |
| 4,859,541 | 8/1989 | Maxeiner et al. | 428/545 |
| 4,882,212 | 11/1989 | Singhdeo et al. | 428/76 |
| 4,921,822 | 5/1990 | Luthra | 501/95 |

FOREIGN PATENT DOCUMENTS 0088992 9/1983 European Pat. Off. .
0270099 6/1988 European Pat. Off. .

Primary Examiner—Paul J. Thibodeau
Assistant Examiner—R. Follett
Attorney, Agent, or Firm—Panitch Schwarze Jacobs & Nadel

[57] ABSTRACT

A substrate made of a composite material is provided which includes a discrete phase including grains made of a first substance; and a continuous phase including a thin coating film made of a second substance and formed on the surface of the grains. The thin coating film has a mean thickness smaller than the mean particle size of the grains. The grains are separated substantially from each other by the thin coating film. The porosity of the composite material is 5% or less.

2 Claims, 1 Drawing Sheet

COMPOSITE SUBSTRATE

BACKGROUND OF THE INVENTION

1. Field of the Invention

The present invention relates to an inorganic composite substrate of high rigidity which is suitable for many applications such as electronic and structural materials.

2. Description of the Prior Art

As substrates for electronic components, such as IC substrates or magnetic head substrates, or as structural materials in various industrial areas, various substrates fabricated from materials possessing properties appropriate to their particular applications are employed. For example, materials such as resin-ceramic and metal-ceramic composites are well known as substrates for electronic circuits. However, substrates fabricated from the aforementioned resin-ceramic composites have the shortcoming of low rigidity. The metal-ceramic composites have, for example, the form of metal particles dispersed in a ceramic base layer. This metal-ceramic composite is relatively rigid. However, in substrates composed of such a composite, the amount of the ceramic material compared with that of metal particles is large, thus, the properties of metal could hardly be obtained. Moreover, the distances between the particles dispersed in the ceramic layer is large, and consequently the mechanical strength of such substrates is low.

Materials such as titanium-magnesium-nickel oxide composites are widely used as magnetic head substrates. However, the degree of wear incurred during use is different for titanium oxide, magnesium oxide and nickel oxide, and consequently minute irregularities appear on the surface of the substrate. Moreover, unduly low electrical resistivity constitutes another shortcoming of this type of composite material. Materials for use as magnetic head substrates should desirably possess good wear resistance, and proper compatibility (such as compatibility of expansion coefficient) with the alloys from which magnetic heads are composed.

At present, high thermal conductivity is considered as a desirable property in IC substrates mainly made of aluminum, while heat resistance, good electrical insulation characteristics and high thermal conductivity are desirable in IC substrates mainly made of a resin.

For example, materials for magnetic head substrates and IC substrates should desirably possess the special properties combining good workability and high mechanical strength with good electrical insulation characteristics.

SUMMARY OF THE INVENTION

The substrate made of a composite material of this invention, which overcomes the above-discussed and numerous other disadvantages and deficiencies of the prior art, comprises a discrete phase including grains made of a first substance; and a continuous phase including a thin coating film made of a second substance and formed on the surface of the grains, the thin coating film having a mean thickness smaller than the mean particle size of the grains, wherein the grains are separated substantially from each other by the thin coating film and the porosity of the composite material is 5% or less.

In a preferred embodiment, the above-mentioned first substance is a metal and the above-mentioned second substance is a dielectric.

In a preferred embodiment, the above-mentioned grains made of the first substance have a flat shape.

Thus, the invention described herein makes possible the objectives of (1) providing a substrate made of two or more substances, possessing the desirable properties of both substances, and, moreover, having high mechanical strength and high rigidity; and (2) providing a composite substrate made of metal and dielectric materials, possessing the aforementioned superior properties as well as the mechanical strength and workability characteristic of metals in addition to good electrical resistivity.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
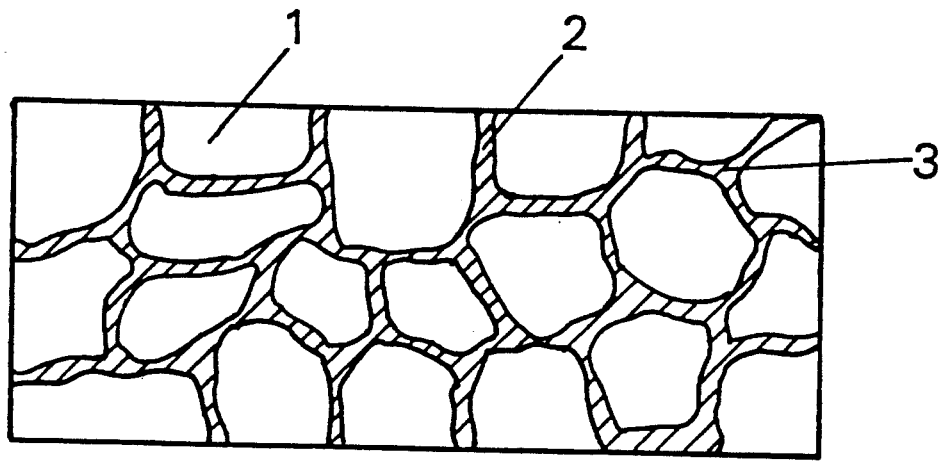
FIG. 1 and FIG. 2 are enlarged partial sectional views of the composite substrate of the present invention.

A substrate of this invention is made of a composite material that comprises a discrete phase including grains made of a first substance; and a continuous phase including a thin coating film made of a second substance and formed on the surface of said grains, said thin coating film having a mean thickness smaller than the mean particle size of said grains. The above-mentioned grains are separated substantially from each other by the thin coating film.

The aforementioned first and second substances are appropriately selected in accordance with the properties required in the final composite substrate. For example, the first and second substance can be selected from among the various categories of inorganic substances including metals, metal oxides, metal nitrides and ceramics. For example, when a metal (e.g., aluminum) and a dielectric (e.g., aluminum oxide or aluminum nitride) are selected as the first and second substances respectively, a composite material having the properties of these two substances is obtained.

Preparation of the aforementioned composite materials comprises the steps of preparing coated particles by forming a film of the aforementioned second substance on the surfaces of particles composed of the aforementioned first substance, and compacting of these coated particles followed by densification treatment. Any well known method can be used to form the film composed of the aforementioned second substance. For example, the following methods are employed. In the first method, particles composed of the first substance are allowed to come into contact with an active gas, whereby the said active gas reacts with the said first substance on the surfaces of the particles, thus forming a layer of a substance different from the original first substance on the particle surfaces. In the second method a sputtering procedure is employed to form a layer of the second substance on the surfaces of particles composed of the first substance. In the first method a mechanical alloying process is employed to deposit a layer of the second substance on the particle surfaces. The layer of the second substance should be thinner than the mean grain size of the particles composed of the aforementioned first substance. The appropriate sizes of the aforementioned particles and film will vary according to the particular purpose and type of substrate, but ordinarily the range of grain sizes is 0.1-100 μm, while the thickness of the film is 5-50 nm. Examples of the formation of the aforementioned film include the formation of metallic oxide films on the surfaces of metal particles by oxidation treatment, as well as the deposition of metals onto the surfaces of metal particles of different kinds of metal by sputtering.

Next, the coated particles prepared in this manner are compacted and subjected to a densification process to finally obtain the composite substrate of the present invention. For example, if the particles are composed primarily of ceramics (i.e., if the particles of the aforementioned first substance are of ceramic composition), then the coated particles can be compacted into the desired shape and densified merely by sintering. In general, densification can be achieved by high-temperature and high-pressure treatment. Ordinarily, densification is accomplished by treatment at a temperature of 300° C. or higher and pressure of 100 kg/cm$^2$ or higher.

In the aforementioned process of densification, a portion of the films on the aforementioned coated particles may in many cases be broken by the operations of compression, etc., thereby exposing the particle surfaces composed of the first substance. Therefore, densification is ordinarily performed in such a manner that a covering film is again formed by the second substance or third substance that is different from the first and second substances. For example, if the aforementioned densification is performed in an atmosphere of an active gas, the first substance on the exposed surfaces reacts with the active gas, thereby forming another film. Oxygen or nitrogen, for example, may be used as the active gas.

As shown in FIG. 1, this composite material is made of particles of the first substance (e.g., aluminum particles) 1 separated by a continuous phase composed of a film of the second substance (e.g., aluminum oxide) 2.

Figure 2:
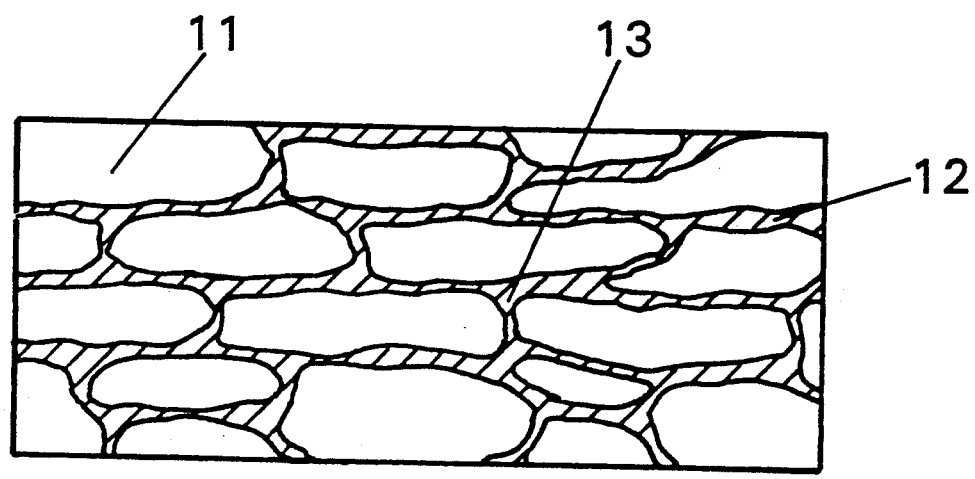

A composite with the morphology illustrated in FIG. 2, containing flat particles 11 and a continuous phase 12 composed of the second substance, can be obtained by applying a larger pressure in just a single direction during the densification process employed in the preparation of the composite. Also, flat particles can be used ab initio for the preparation of the composite. Such composite materials display high hardness along the direction of the longitudinal axes of the particles, and superior wear resistance. In the cross-sectional view of both of the aforementioned composites, the area occupied by triangular regions (i.e., regions bounded by three or more particles), indicated by the reference numerals 3 and 13 in FIGS. 1 and 2, respectively, is small as compared with conventional types of composites, therefore substrates made of the composite display superior mechanical strength. The porosity of the composite substrates of the present invention should ordinarily be 5% or less (i.e., a density of 95% or more), and preferably 3% or less. When the porosity is 5% or less, the existing pores will be closed, and the interior of the composite structure will not communicate with the exterior, therefore, the composite displays high mechanical strength as well as superior weather and chemical resistance. Composite substrates obtained in this manner possess a synergistic combination of the properties of the first and second substances. For example, if the first substance is a metal and the second substance is a metal oxide, then the composite will possess both metallic properties and dielectric characteristics. For example, a composite substrate is provided in which metal is contained in an amount of 99.9% based on the total weight of the composite substrate, while also possessing electrically insulating characteristics.

EXAMPLES

This invention will be described by reference to the following non-limiting examples.

Example 1

Aluminum powder composed of nearly spherical particles of mean grain size of 15 μm were subjected to oxidation treatment for 2 hours at 300° C. in a 5% oxygen atmosphere. This oxidized aluminum powder was then formed into a plate shape and subjected to hot pressing (pressure sintering) at 500° C. under a pressure of 500 atm in a 0.5% oxygen atmosphere. The high-rigidity approximately twice the hardness of aluminum, and the electrical resistivity of the surface of this substrate, as measured by a tester, was above 20M Ω-cm or higher. Moreover, the porosity of this substrate was less then 5%, while the relative area of triangular regions in the cross-section was approximately 3%.

When the oxidized aluminum powder was hot pressed in a nitrogen atmosphere (not in a 5% oxygen atmosphere) after the aforementioned forming process, the electrical resistivity measured by the above-mentioned method was approximately 60k Ω-cm. This suggests that even during the aforementioned sintering process, the oxidation of the particle surfaces progresses and aluminum oxide is efficiently formed. Since the composite substrate prepared in a 0.5% oxygen atmosphere was harder than the original aluminum, a somewhat larger force was required for machining, but nevertheless the material could be machined by nearly the same methods as those used for conventional aluminum materials.

In the hot pressing treatment, a larger pressure was applied in only a single direction, then the originally spherical particles were deformed into depressed or flattened particles having long and short diameters with a ratio of at least 2:1. By suitably adjusting the pressure and the direction of application of the force, the degree of flatness can be further changed. In this manner, hot pressing was applied so as to form flattened particles such that the ratio of long to short diameter was about 10:1; the resulting material had a porosity of less than 1% and a relative area of triangular regions of not exceeding 0.5%. Substrates fabricated in this manner display high hardness and wear resistance in the direction of the major axes of the particles. In particular, these substrates possess the advantage of easy workability along the flat surfaces of the particles.

Example 2

Aluminum powder of the same type as was used in Example 1 and titanium monohydride particles (mean particle diameter 15 μm) were mixed in a ball mill for 80 hours to effect surface modification of the aluminum powder. After this treatment, the powder was heated at 550° C. in an atmosphere of nitrogen gas, thus effecting nitridation of the surface. This material was then formed into a plate shape and subjected to hot pressing (pressure sintering) at 400° C. under a pressure of 500 atm, thereby obtaining a high-rigidity inorganic substrate with a hardness approximately 1.5 times that of the substrate obtained when aluminum powder was used, and with an electrical resistivity of 20M Ω-cm.

The substrates obtained in this manner displayed excellent thermal conductivity, close to that of aluminum, indicating excellent suitability for use as substrates in heating elements. Owing to this superior thermal conductivity, these substrates are well suited for use as IC substrates. Moreover, unlike ordinary aluminum, the electrical insulation performance of this material is extremely high. Furthermore, this material can provide excellent substrates which are perfectly suitable for printed circuit boards and display thermal resistance as well as rigidity which are characteristic of metals. In cases where the spacing between wiring is close to the grain size (i.e., 15 $\mu$m) of the above-mentioned aluminum particles, the use of particles with still smaller grain size (i.e., smaller than 15 $\mu$m) or processing so as to form flattened particles constitute appropriate measures in the manufacture of IC substrates.

Example 3

Aluminum powder composed of nearly spherical particles of mean grain size of 5 $\mu$m were subjected to oxidation treatment for 2 hours at 300° C. in a 1% oxygen atmosphere. This oxidized aluminum powder was then formed into a plate shape and subjected to hot pressing (pressure sintering) at 500° C. under a pressure of 500 atm in a 0.5% oxygen atmosphere. The high-rigidity inorganic composite substrate so obtained possesses approximately twice the hardness of aluminum, and the electrical resistivity of the surface of this substrate, as measured by a tester, was above 20M $\Omega$-cm or higher. Moreover, the porosity of this substrate was less then 4%, while the relative area of triangular regions in the cross-section was 2.5% or lower. Thus, in the present example, wherein the aluminum powder used was of smaller grain than that employed in Example 1, sintering in a atmosphere of nitrogen gas resulted in a lower electrical insulation performance.

Example 4

Next, an example of the use of metals with high thermal expansion coefficients in magnetic head substrates will be described. In general, although possessing good wear resistance, metal oxides are electrical insulators and therefore display inferior magnetic characteristics, and, moreover, have generally low thermal expansion coefficients, hence, metal oxides have hitherto seen little use as substrates for magnetic heads.

In the present example, stainless steel powder (mean grain diameter 7 $\mu$m) was oxidized for 2 hours at 900° C. in a 1% oxygen atmosphere, and next subjected to high-pressure hot pressing for 2 hours at a temperature of 850° C. and a pressure of 1000 atm. The high-rigidity inorganic composite substrate material so obtained displayed an electrical resistivity of 10 k $\Omega$-cm. The substrate is not liable to be electrostatically charged, and possessed excellent wear resistance. The other characteristics of this substrate are almost the same as those of the original stainless steel, and therefore the material is well suited for use as a magnetic head substrate. Conventionally, the use of metal materials as substrates in magnetic heads for video tape recorders was scarcely considered feasible.

Needless to say, similarly desirable results can also be expected by appropriate use of various composite substrates of this invention other than those specifically mentioned in the above examples.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A substrate made of a composite material comprising:
    a discrete phase including grains made of a first substance; and
    a continuous phase including an inorganic thin coating film of 5–50 nm thickness made of a second substance and formed on the surface of said grains, said inorganic thin coating film having a mean thickness smaller than the mean particle size of said grains, said grains having a mean particle size of about 5 $\mu$m to about 100 $\mu$m,
    wherein said grains are separated from each other by said inorganic tin coating film and the porosity of said composite material is 5% or less, wherein said first substance is selected from the group consisting of aluminum and alloys comprising aluminum and said second substance is a dielectric of aluminum nitride, said composite material having an electrical resistivity greater than or equal to 10 k$\Omega$.

2. A substrate according to claim 1, wherein said grains made of the first substance have a flat shape.

* * * * *